(12) United States Patent
Rowell

(10) Patent No.: US 11,621,790 B1
(45) Date of Patent: Apr. 4, 2023

(54) OVER-THE-AIR MEASUREMENT SYSTEM

(71) Applicant: Rohde & Schwarz GmbH & Co. KG, Munich (DE)

(72) Inventor: Corbett Rowell, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 17/505,410

(22) Filed: Oct. 19, 2021

(51) Int. Cl.
*H04B 17/00* (2015.01)
*H04B 17/15* (2015.01)
*G01R 29/10* (2006.01)

(52) U.S. Cl.
CPC ........... *H04B 17/15* (2015.01); *G01R 29/105* (2013.01)

(58) Field of Classification Search
CPC .... H04B 17/15; H04B 17/0085; H04B 17/29; H04B 7/10; H04B 17/309; H04B 17/16; H04B 17/00; H04B 17/19; G01R 29/105; G01R 31/3025; G01R 29/0821
See application file for complete search history.

(56) References Cited

U.S. PATENT DOCUMENTS

| | | | |
|---|---|---|---|
| 3,357,021 A | | 12/1967 | Allen |
| 4,549,310 A | * | 10/1985 | Woodward ............... H01P 1/16 333/251 |
| 10,523,801 B1 | * | 12/2019 | Rowell ............. H05K 7/20136 |
| 2014/0256267 A1 | * | 9/2014 | Chien .................. H04W 24/06 455/67.12 |
| 2021/0063480 A1 | * | 3/2021 | Toben-Heiken ......... H01Q 1/50 |

* cited by examiner

*Primary Examiner* — Nhan T Le
(74) *Attorney, Agent, or Firm* — Christensen O'Connor Johnson Kindness PLLC

(57) ABSTRACT

The present disclosure provides an over-the-air measurement system for testing a device under test. The over-the-air measurement system includes a single measurement antenna and a rotary antenna positioner for the measurement antenna. The over-the-air measurement system further comprises a hardware trigger that is capable of triggering a measurement. The hardware trigger is associated with the rotary antenna positioner. The over-the-air measurement system comprises at least one rotary joint attached to the antenna positioner.

20 Claims, 2 Drawing Sheets

OVER-THE-AIR MEASUREMENT SYSTEM

FIELD OF THE DISCLOSURE

Embodiments of the present disclosure relate generally to an over-the-air measurement system for testing a device under test.

BACKGROUND

In the state of the art, over-the-air (OTA) measurement systems for testing a device under test are known. Typically, so-called compact antenna test ranges (CATRs) are used to test the respective device under test, wherein the compact antenna test range has a testing chamber, e.g. an anechoic chamber also called RF-shielded chamber, in which the device under test is placed for testing purposes. The measurement system provides a quiet zone within the testing chamber, wherein the quiet zone is associated with a testing location at which the device under test is placed during the testing. In compact antenna test ranges, at least one reflector may be used that is located in a beam path established between the test location and a respective feed antenna, also called measurement antenna, in order to increase the travelling distance of the electromagnetic waves, thereby ensuring (indirect) far-field (IFF) conditions at the test location located within the quiet zone.

The respective devices under test typically comprise dual-polarized antennas so that it is necessary to make a minimum of four measurements with four different measurement polarizations in order to measure axial ratio and maximum power of the respective device under test. For instance, the devices under test use dual-polarized electromagnetic waves. Hence, the devices under test may relate to FR1 and/or FR2 base stations, FR2 user equipment and radar devices.

In the state of the art it is known to use two separately formed feed antennas and a mechanical feed switcher that mechanically moves the feed antennas in order to test the four different measurement polarizations.

In other words, the feed antennas are changed mechanically, namely moved, which however increases the overall costs of the over-the-air measurement system. In addition, the overall measurement time is relatively high due to the fact that the measurement has to be interrupted when moving the feed antennas.

Therefore, there is a need for a cost-efficient way to perform the respective tests.

SUMMARY

Embodiments of the present disclosure provide an over-the-air measurement system for testing a device under test. In an embodiment, the over-the-air measurement system comprises a single measurement antenna and a rotary antenna positioner for the measurement antenna. The over-the-air measurement system further comprises a hardware trigger that is capable of triggering a measurement. The hardware trigger is associated with the rotary antenna positioner. The over-the-air measurement system comprises at least one rotary joint attached to the antenna positioner.

Further, embodiments of the present disclosure provide a method of testing a device under test. In an embodiment, the method comprises the steps of:

Rotating a single measurement antenna continuously by a rotary antenna positioner connected with a single measurement antenna, Issuing trigger signals by a hardware trigger to a measurement equipment depending on an angular position of the single measurement antenna, Receiving the trigger signals by the measurement equipment, Processing the trigger signals by the measurement equipment, and Performing measurements at different measurement polarizations by the measurement equipment based on the trigger signals received.

The main idea is to continuously rotate the single measurement antenna during testing, for example at high speed, while the hardware trigger associated with the rotary antenna positioner sends trigger signals for triggering the respective measurements. Hence, measurements of at least four different measurement polarizations are performed in a fast manner while the measurement antenna rotates. In some embodiments, the number of different measurement polarizations depend on the frequency of the trigger signals issued by the hardware trigger, e.g. its resolution. For instance, four different measurement polarizations are obtained when issuing trigger signals every 45°.

Accordingly, the hardware trigger is used to trigger the measurement equipment to perform the respective measurement. The hardware trigger may be established by an optical encoder that sends a trigger signal, for instance a pulse, every 45° of rotational movement of the measurement antenna that is moved by the rotary antenna positioner. The hardware trigger generally ensures fast measurements.

The rotary joint ensures that a radio frequency cable connected with the single measurement antenna is not twisted when rotating the single measurement antenna by the rotary antenna positioner.

In general, the continuous rotation of the measurement antenna means that the measurement antenna is not rotated in a stepwise manner.

An aspect provides that the single measurement antenna is a single polarized antenna. Thus, it is not necessary that an orthomode transducer (OMT) is used, which makes the entire over-the-air measurement system less cost-intensive. Irrespective of the costs, it is also not possible to continuously rotate an orthomode transducer since the orthomode transducer is connected with two cables that would twist with each other when rotating the orthomode transducer.

In other words, the measurement system is established in an OMT-free manner, namely without orthomode transducer, such that a wider bandwidth can be ensured by the single polarized antenna compared to antennas interacting with orthomode transducers.

Another aspect provides that a single input interface for the measurement antenna is provided. Since the single measurement antenna may be established by a single polarized antenna, a single input interface for connecting only one radio frequency (RF) cable is sufficient.

The continuous rotation of the measurement antenna ensures a fast measurement even though a single polarized measurement antenna is used, which usually increases the measurement time by 2-3 times compared to a dual-polarized measurement antenna. However, the rotary antenna positioner that continuously rotates the single polarized measurement antenna ensures almost similar measurement times compared with using a dual-polarized measurement antenna. In some embodiments, 4-16 different measurement polarizations are obtained in an only marginally slower manner than a typical dual-polarized measurement. As indicated above, a dual-polarized antenna cannot be rotated continuously, as the two cables twist around each other when rotating the dual-polarized antenna.

The over-the-air measurement system may comprise an RF-shielded chamber. The RF-shielded chamber ensures that interfering or disturbing signals can be shielded appropriately such that the testing conditions are improved, yielding more reliable characterizations of the device under test.

In addition, the over-the-air measurement system may comprise a measurement equipment. The measurement equipment may be used for generating the respective signals to be issued by the single measurement antenna. As discussed above, the hardware trigger may issue the respective trigger signals to the measurement equipment in order to trigger the measurement, namely forwarding the measurement signals to the single measurement antenna.

Furthermore, analysis equipment may be provided that is connected with the measurement antenna and/or the device under test in order to receive signals to be analyzed to characterize the behavior of the device under test during the testing.

The hardware trigger may be connected with the measurement equipment, wherein the hardware trigger is configured to trigger the measurement equipment to perform a respective measurement. Generally, this may relate to issuing a measurement signal to be transmitted towards the device under test or rather to perform acquire a signal issued by the device under test.

Further, the antenna positioner may be configured to rotate the single measurement antenna continuously. Thus, the rotary antenna positioner is enabled to rotate the single measurement antenna without slowing down or rather stopping. Hence, the continuous rotation of the single measurement antenna distinguishes from a stepped rotation of the single measurement antenna.

The hardware trigger may be configured to issue a trigger signal such that measurements at different measurement polarizations are performed. Therefore, it is possible to test a dual-polarized device under test in order to perform axial ratio measurements of the device under test appropriately. Generally, a minimum of four measurements with four different measurement polarizations are necessary to characterize a dual-polarized device under test sufficiently, e.g., a device under test having a dual-polarized antenna.

In some embodiments, the hardware trigger is configured to issue the trigger signal every 45° of rotation of the measurement antenna when the antenna positioner rotates the single measurement antenna. This ensures that four different measurement polarizations are obtained.

The over-the-air measurement system may further comprise a rectangular-to-circular adapter. Accordingly, a horn antenna may be used as the single measurement antenna that is connected with the circular interface of the rectangular-to-circular adapter.

Further, the over-the-air measurement system may comprise a coax-to-waveguide adapter. A coaxial cable, namely a radio frequency (RF) cable, may be connected with the coax interface of the coax-to-waveguide adapter, which in turn is connected with a waveguide via its waveguide interface.

In some embodiments, the over-the-air measurement system comprises a rectangular-to-circular adapter, wherein the rectangular-to-circular adapter is connected with the coax-to-waveguide adapter. The respective connection may be established by a waveguide that is connected to the rectangular interface of the rectangular-to-circular adapter and the waveguide interface of the coax-to-waveguide adapter.

Moreover, the coax-to-waveguide adapter may be connected with the at least one rotary joint. The coaxial cable connected with the coax-to-waveguide adapter may be guided by the rotary joint that is connected with the coax-to-waveguide adapter accordingly.

Furthermore, the over-the-air measurement system may comprise a positioner system for the device under test. The positioner system may be used for rotating the device under test during the testing in order to characterize the device under test sufficiently, for example in several directions. In some embodiments, the positioner system may be a three-dimensional (3D) positioner system, for instance a phone positioner and a tablet positioner in case of testing a mobile phone or rather a tablet.

In general, the positioner system ensures highly accurate azimuth and elevation positioning of the device under test.

In some embodiments, total radiated power (TRP) measurements can be performed accurately and fast.

The over-the-air measurement system may be a far-field system such that far-field characteristics of the device under test can be tested appropriately. In some embodiments, direct far-field conditions may be provided due to the distances ensured between the antenna and the device under test.

Moreover, the over-the-air measurement system may be a compact antenna test range (CATR) system. Accordingly, (indirect) far-field conditions are obtained, wherein a reflector is provided that is used for increasing the travelling distance of the electromagnetic waves. In other words, a beam path is established between the single measurement antenna and the device under test via a respective reflector that is associated with the compact antenna test range (CATR) system.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result.

Moreover, some of the method steps can be carried serially or in parallel, or in any order unless specifically expressed or understood in the context of other method steps.

Figure 1:
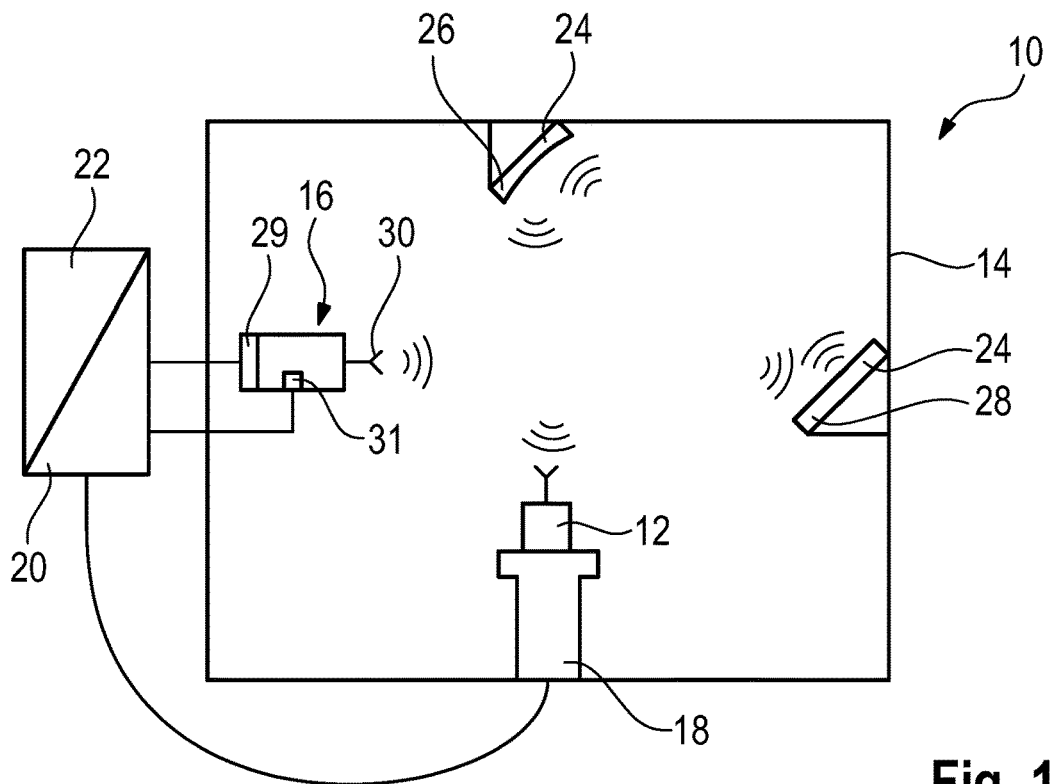
FIG. 1 schematically shows an overview of an over-the-air measurement system according to an embodiment of the present disclosure, FIG. 2 schematically shows an overview of an over-the-air measurement system according to another embodiment of the present disclosure FIG. 3 schematically shows a front view on the antenna assembly used in the over-the-air measurement system.

FIG. 1 shows an over-the-air measurement system 10 that is used for testing a device under test 12. The over-the-air measurement system 10 comprises an anechoic or RF shielded chamber 14 that accommodates the device under test 12 as well as an antenna assembly 16 that is used for testing the device under test 12 as will be described hereinafter in more detail, for example with reference to FIG. 3.

The over-the-air measurement system 10 further comprises a positioner system 18 for the device under test 12, wherein the positioner system 18 may be configured to rotate the device under test 12 at least along one rotational axis during the testing, for example in a three-dimensional manner, namely along at least two rotational axes. In an embodiment, the positioner system 18 includes at least one rotational stage, and in other embodiments, includes two or more rotational stages. The device under test 12 is mounted on the positioner system 18.

The over-the-air measurement system 10 may also comprise measurement equipment 20 as well as analysis equipment 22, which are connected with the antenna assembly 16 and/or the positioner system 18 appropriately. Further, signals received by the device under test 12 may be forwarded to the analysis equipment 22 such that a respective communication connection is also established between the device under test 12 and the analysis equipment 22. Moreover, the measurement equipment 20 may be connected to the device under test 12. In some embodiments, the measurement equipment 20 and/or the analysis equipment 22 includes circuitry configured to measure and/or analyze signals, data, etc.

The respective connections between the measurement equipment 20 and the antenna assembly 16 may be established by a radio frequency cable that forwards signals to the antenna assembly 16.

Furthermore, it is shown in FIG. 1 that the over-the-air measurement system 10 comprises two reflectors 24, namely a main reflector 26 as well as a sub-reflector 28. Accordingly, the over-the-air measurement system 10 shown in FIG. 1 is a multi-reflector system. In the shown embodiment, the main reflector 26 is established as a paraboloid reflector, whereas the sub-reflector 28 is established as a non-paraboloid reflector.

The main reflector 26 may be orientated towards the device under test 12, for example a test location at which the device under test 12 is positioned for testing purposes, whereas the sub-reflector 28 is orientated towards the antenna assembly 16. The reflectors 24 may further be orientated towards each other. Hence, beam paths are established between the antenna assembly 16 and the device under test 12 via the respective reflector(s) 24 as indicated in FIG. 1.

In the shown embodiment, the antenna assembly 16 has a rotary antenna positioner 29 to which a single measurement antenna 30 is connected that is directed towards the respective reflector(s) 24, for example the sub-reflector 28. The rotary antenna positioner 29 is generally configured to rotate the single measurement antenna 30 continuously during the testing of the device under test 12. In an embodiment, the rotary antenna positioner 29 includes one or more rotational stages to rotate the single measurement antenna 30.

In addition, the antenna assembly 16 comprises a hardware trigger 31 that is capable of triggering a measurement, wherein the hardware trigger 31 is associated with the rotary antenna positioner 29 such that the hardware trigger 31 issues a trigger signal depending on the angular position of the single measurement antenna 30 set by the rotary antenna positioner 29. In an embodiment, the hardware trigger 31 includes circuitry configured to generate a trigger signal based on the angular position of the single measurement antenna 30 set by the rotary antenna positioner 29.

In the shown embodiment of FIG. 1, the reflectors 24 are located at two different lateral walls, e.g. a side wall and a ceiling. Of course, the reflectors 24 may also be located at a side wall and a bottom wall or rather at two different side walls. The same applies for the antenna assembly 16 that may be associated with a side wall, a bottom wall or rather a ceiling, which merely depends on the overall dimensions of the over-the-air test system 10.

Figure 2:
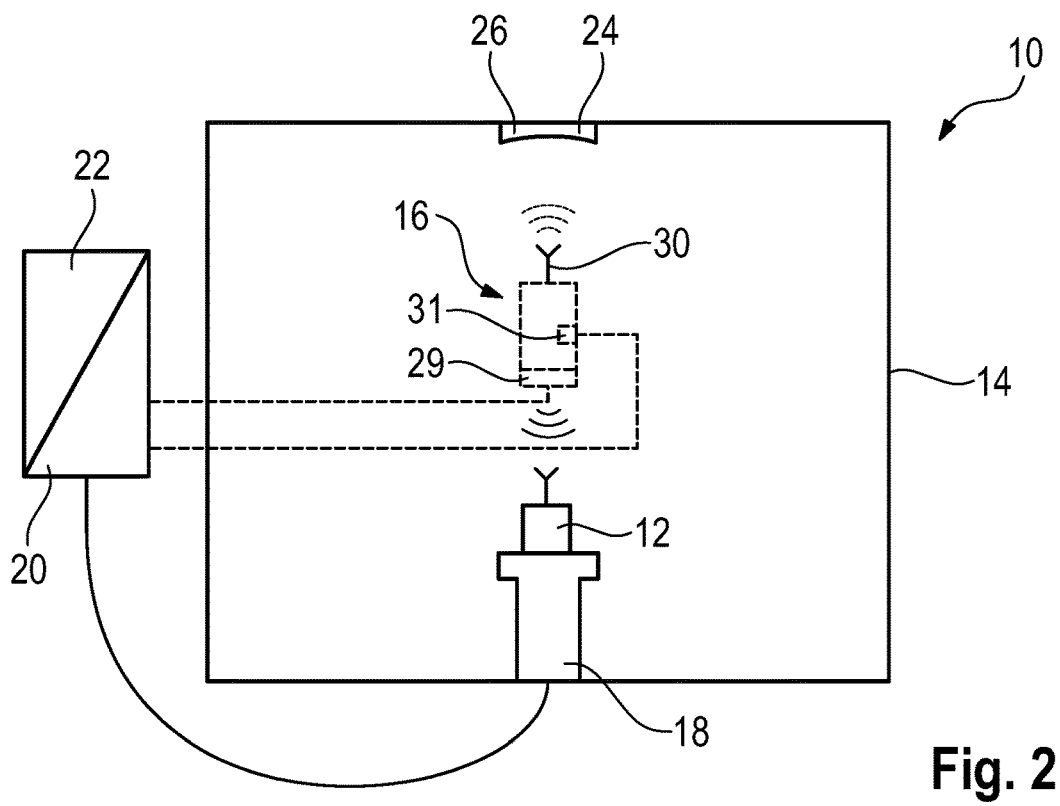

In FIG. 2, another embodiment of the over-the-air measurement system 10 is shown, which comprises only a single reflector 24. Accordingly, the over-the-air measurement system 10 shown in FIG. 2 is a single-reflector system. The single reflector 24 corresponds to the main reflector 26 that is located in the beam path established between the device under test 12, e.g., a test location of the device under test 12, and the antenna assembly 16.

As shown in FIG. 2, the (feed) antenna 30 of the antenna assembly 16 points towards the reflector 24, e.g., its center, wherein the reflector 24, for example its center, is centered with respect to the device under test 12, e.g. a test location of the device under test 12.

The antenna assembly 16 may be located in a different plane with respect to the device under test 12 such that the signals impinging on the reflector 24, namely the main reflector 26, and the ones reflected by the reflector 24, namely the main reflector 26, do not interfere with each other.

Figure 3:
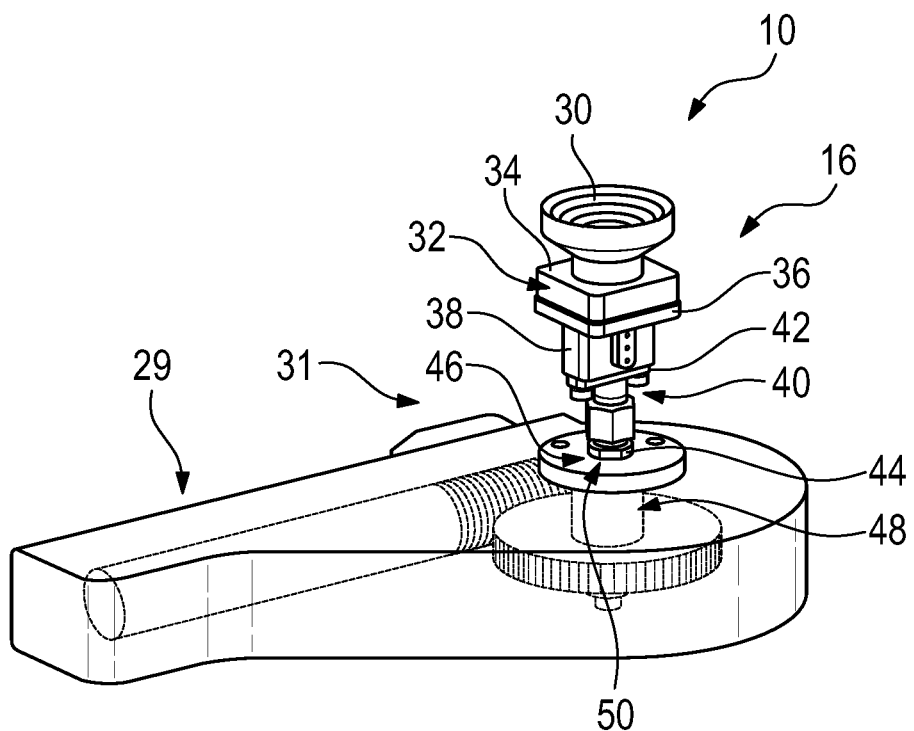

The respective arrangement of the measurement system 10, e.g., the antenna assembly 16, is shown in FIG. 3 in more detail to which reference is made hereinafter.

In general, the interaction of the rotary antenna positioner 29 and the hardware trigger 31 ensures that axial ratio measurements of the respective device under test 12 having dual-polarized antenna(s) can be performed inside the anechoic or rather RF-shielded chamber 14 without the necessity of a feed switch or rather an orthomode transducer (OMT), thereby reducing the costs and the complexity of the measurement system 10.

In FIG. 3, the antenna assembly 16 is shown in more detail. The antenna assembly 16 comprises the single measurement antenna 30 that is established as a single-polarized antenna, e.g., a horn antenna.

The single measurement antenna 30 is connected to a rectangular-to-circular adapter 32 that provides a circular interface 34 for the single measurement antenna as well as a rectangular interface 36 for a waveguide 38. Hence, a rectangular waveguide 38 is connected to the rectangular interface 36, which extends to a waveguide-to-coax adapter 40 that provides a waveguide interface 42 as well as a coax interface 44 for a coaxial cable 46, e.g., a radio frequency (RF) cable via which the single measurement antenna 30 receives measurement signals to be emitted. Alternatively, the measurement antenna 30 receives electromagnetic signals that are processed by the antenna assembly 16 so that the received electromagnetic signals are forwarded to the measurement equipment 22 by the coaxial cable 46.

In addition, a rotary joint 48 is attached to the rotary antenna positioner 29 that is used for guiding the coaxial cable 46.

Hence, the rotary antenna positioner 29 is enabled to rotate the single measurement antenna 30 during the respective measurements in a continuous manner, e.g., in a stepless or rather non-stepped manner.

Since the measurement antenna 30 is a single-polarized antenna that is connected to only a single line via a single input interface 50, the positioner 29 is enabled to rotate the single measurement antenna 30 continuously, for example at high speeds. Hence, the overall measurement time is not increased compared to prior art techniques using dual-polarized measurement antennas even though a single-polarized measurement antenna 30 is used.

In some embodiments the hardware trigger 31 includes, for instance, an optical encoder, that issues a trigger signal depending on the rotational position of the measurement antenna 30 in order to trigger a measurement to be performed by the measurement equipment 22.

Figure 4:
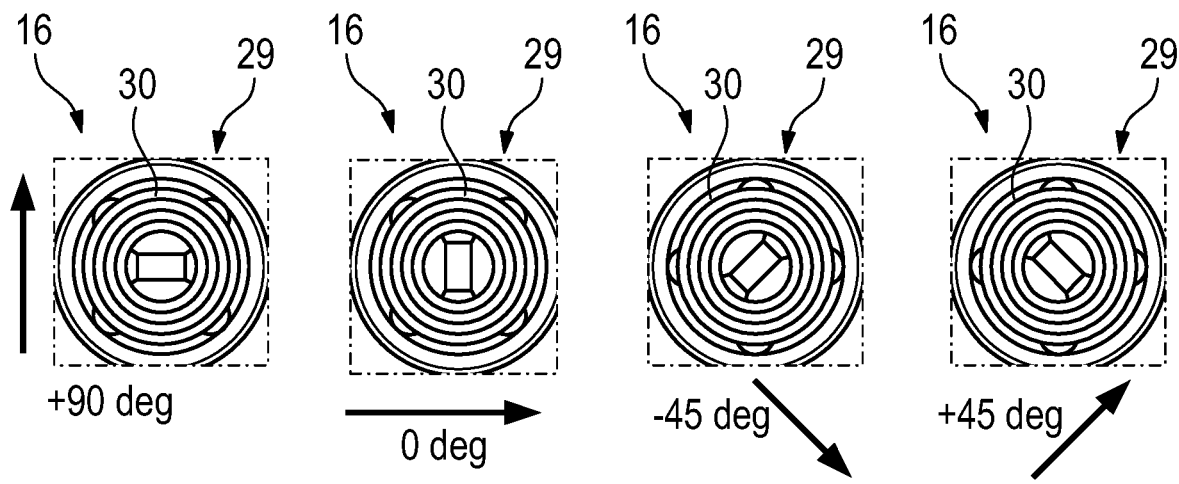
FIG. 4 shows an isometric view on the antenna assembly of FIG. 3.

According to the embodiment shown in FIG. 4, the hardware trigger 31 issues trigger signals every 45° of rotation of the single measurement antenna 30 such that at least four different measurement polarizations are obtained, namely at +90°, 0°, −45°, and +45°.

Accordingly, the over-the-air measurement system 10 is generally configured to test the device under test 12 while rotating the single measurement antenna 30 continuously by the rotary antenna positioner 29 that is connected with the single measurement antenna 30. The hardware trigger 31 issues trigger signals based on the rotational orientation of the single measurement antenna 30 and a resolution set, e.g. every 45° or rather every 15°. Generally, an operator may set the respective resolution, thereby setting the number of different measurement polarizations.

The signals are received by the measurement equipment 22 depending on the angular position of the single measurement antenna 30. For instance, every 45° of rotation, a respective trigger signal is issued by the hardware trigger 31 in order to start a respective measurement at a dedicated measurement polarization. As mentioned above, another angular resolution may be set accordingly, resulting in a different number of measurement polarizations.

The trigger signals are received by the measurement equipment 22 which in turn processes the trigger signals in order to perform measurements at different measurement polarizations, wherein the different measurement polarizations depend on the relative rotational orientation of the single measurement antenna 30.

In FIGS. 1 and 2, a compact antenna test range (CATR) is shown, wherein far-field conditions are obtained by the reflector(s) 24, e.g., indirect far-field conditions. However, the antenna assembly 16 may also be used in an over-the-air measurement system 10 without additional reflector(s) provided that the respective distances are ensured to obtain far-field conditions for testing the device under test 12. Hence, the over-the-air measurement system 10 may also be a far-field system.

Therefore, a simple and cost-efficient over-the-air test system 10 is obtained for testing dual-polarized devices under test 12 in a fast manner.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An over-the-air measurement system for testing a device under test, wherein the over-the-air measurement system comprises a single measurement antenna and a rotary antenna positioner for the measurement antenna, wherein the over-the-air measurement system further comprises a hardware trigger that is capable of triggering a measurement, wherein the hardware trigger is associated with the rotary antenna positioner, wherein the hardware trigger is capable of sending a trigger signal for triggering a respective measurement, wherein the hardware trigger is capable of issuing the trigger signal such that measurements at different measurement polarizations are performed, and wherein the over-the-air measurement system comprises at least one rotary joint attached to the antenna positioner.

2. The over-the-air measurement system according to claim 1, wherein the single measurement antenna is a single polarized antenna.

3. The over-the-air measurement system according to claim 1, wherein a single input interface for the measurement antenna is provided.

4. The over-the-air measurement system according to claim 1, wherein the over-the-air measurement system comprises an RF-shielded chamber.

5. The over-the-air measurement system according to claim 1, wherein the over-the-air measurement system comprises a measurement equipment.

6. The over-the-air measurement system according to claim 5, wherein the hardware trigger is connected with the measurement equipment, and wherein the hardware trigger is configured to trigger the measurement equipment to perform a measurement.

7. The over-the-air measurement system according to claim 1, wherein the antenna positioner is configured to rotate the single measurement antenna continuously.

8. The over-the-air measurement system according to claim 1, wherein the hardware trigger is configured to issue the trigger signal every 45 degrees of rotation of the measurement antenna when the antenna positioner rotates the single measurement antenna.

9. The over-the-air measurement system according to claim 1, wherein the over-the-air measurement system comprises a rectangular-to-circular adapter.

10. The over-the-air measurement system according to claim 1, wherein the over-the-air measurement system comprises a coax-to-waveguide adapter.

11. The over-the-air measurement system according to claim 10, wherein the over-the-air measurement system comprises a rectangular-to-circular adapter, and wherein the rectangular-to-circular adapter is connected with the coax-to-waveguide adapter.

12. The over-the-air measurement system according to claim 10, wherein the coax-to-waveguide adapter is connected with the at least one rotary joint.

13. The over-the-air measurement system according to claim 1, wherein the over-the-air measurement system comprises a positioner system for the device under test.

14. The over-the-air measurement system according to claim 1, wherein the over-the-air measurement system is a far-field system.

15. The over-the-air measurement system according to claim 1, wherein the over-the-air measurement system is a compact antenna test range system.

16. A method of testing a device under test, wherein the method comprises the steps of:
   rotating a single measurement antenna continuously by means of a rotary antenna positioner connected with the single measurement antenna;
   issuing trigger signals by means of a hardware trigger to a measurement equipment depending on an angular position of the single measurement antenna, wherein the hardware trigger is capable of issuing the trigger signal such that the measurements at different measurement polarizations are performed;
   receiving the trigger signals by means of the measurement equipment;
   processing the trigger signals by means of the measurement equipment, and
   performing measurements at different measurement polarizations by means of the measurement equipment based on the trigger signals received.

17. The method according to claim 16, wherein the trigger signals are issued every 45 degrees of rotation.

18. An over-the-air measurement system for testing a device under test, wherein the over-the-air measurement system comprises a single measurement antenna and a rotary antenna positioner for the measurement antenna, wherein the antenna positioner is capable of rotating the single measurement antenna continuously, wherein the over-the-air measurement system further comprises a hardware trigger that is capable of triggering a measurement, wherein the hardware trigger is associated with the rotary antenna positioner, and wherein the over-the-air measurement system comprises at least one rotary joint attached to the antenna positioner.

19. The over-the-air measurement system according to claim 18, wherein the measurement antenna is not rotated in a stepwise manner.

20. The over-the-air measurement system according to claim 18, wherein the measurement antenna rotates continuously during the testing such that the measurements are performed while the measurement antenna rotates.

* * * * *